United States Patent [19]

Fujita et al.

[11] Patent Number: 4,663,190

[45] Date of Patent: May 5, 1987

[54] PROCESS FOR PRODUCING SEMICONDUCTOR ELEMENT

[75] Inventors: Koei Fujita; Yuji Aimono, both of Hitachi, Japan

[73] Assignee: Hitachi Chemical Company, Ltd., Tokyo, Japan

[21] Appl. No.: 587,586

[22] Filed: Mar. 8, 1984

[51] Int. Cl.⁴ .................. B05D 5/12; H01L 29/28; C08G 59/40
[52] U.S. Cl. .................................. 427/82; 427/386; 528/111; 357/8; 357/10; 357/22; 357/72
[58] Field of Search ............... 528/111; 427/82, 386; 357/22, 8, 10, 72

[56] References Cited

U.S. PATENT DOCUMENTS

| | | | |
|---|---|---|---|
| 4,268,656 | 5/1981 | Ray-Chaudhuri et al. | 528/111 |
| 4,327,369 | 4/1982 | Kaplan | 357/72 |
| 4,358,571 | 11/1982 | Kaufman et al. | 427/386 X |
| 4,423,094 | 12/1983 | Dearlove et al. | 427/386 |

*Primary Examiner*—Thurman K. Page
*Attorney, Agent, or Firm*—Antonelli, Terry & Wands

[57] ABSTRACT

A semiconductor element excellent in moisture resistance and thermal fatigue properties can be produced by forming a seal coating on at least part of the surface of semiconductor material, said seal coating being a cured resin obtained from an epoxy resin composition comprising (i) an epoxy resin, (ii) an organic dibasic acid dihydrazide and (iii) an imidazole.

20 Claims, 2 Drawing Figures

PROCESS FOR PRODUCING SEMICONDUCTOR ELEMENT

BACKGROUND OF THE INVENTION

This invention relates to an epoxy resin composition and a process for producing a semiconductor element having a seal coating of epoxy resin on a semiconductor material and being excellent in moisture resistance and thermal fatigue properties.

Conventional sealing processes for semiconductor elements can be divided into two groups: (1) a low-pressure transfer molding process using powdered epoxy compounds and (2) a potting process using two-component liquid epoxy resins curable with acid anhydrides or amines. The former is suitable for mass production of semiconductors such as diodes, transistors, LSI, etc., and the latter is suitable for the production of composite parts such as power module hybrid integrated circuits (IC), etc.

The epoxy compounds usable for the low-pressure transfer molding are usually those obtained by curing phenol-novolac type epoxy resins or cresol-novolac type epoxy resins with dicyandiamide or a phenol-novolac resin. In the potting process, epichlorhydrin-bisphenol type epoxy resins which are liquid at room temperature are usually cured by using acid anhydrides which are liquid at room temperature.

But there are many defects in these processes in that, in the case of semiconductor elements obtained by the transfer molding, adhesiveness between lead terminals and the resin is poor due to the presence of an internal mold release agent, moisture is easily penetrated from the interface and thus reliability is not sufficient, while in the case of the potting process, ester bonds present in the cured product are poor in moisture resistance.

SUMMARY OF THE INVENTION

It is an object of this invention to provide a process for producing a semiconductor element using a special epoxy resin composition for sealing a semiconductor material overcoming the defects of prior art processes and an epoxy resin composition.

This invention provides a process for producing a semiconductor element which comprises forming a seal coating on at least part of the surface of a body of semiconductor material, said seal coating being a cured resin obtained from an epoxy resin composition comprising (i) an epoxy resin having at least one epxoy group in its molecule, (ii) an organic dibasic acid dihydrazide in an amount of 3 to 20 moles per 100 moles of the epoxy resin, and (iii) an imidazole of the formula:

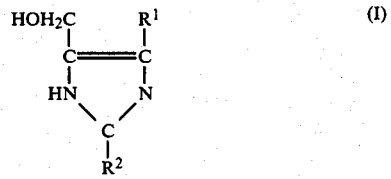

wherein $R^1$ is hydrogen, an alkyl group or a hydroxymethyl group; and $R^2$ is an alkyl group or a phenyl group, in an amount of 1 to 7 moles per 100 moles of the epoxy resin, and the semiconductor element thus produced.

This invention also provides an epoxy resin composition comprising (i) an epoxy resin having at least one epoxy group in its molecule, (ii) an organic dibasic acid dihydrazide in an amount of 3 to 20 moles per 100 moles of the epoxy resin, and (iii) an imidazole of the formula:

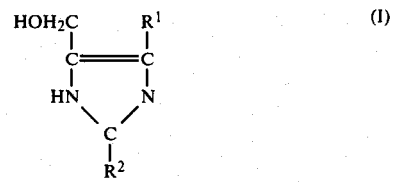

wherein $R^1$ is hydrogen, an alkyl group or a hydroxymethyl group; and $R^2$ is an alkyl group or a phenyl group, in an amount of 1 to 7 moles per 100 moles of the epoxy resin.

DESCRIPTION OF THE PREFERRED EMBODIMENTS

Figure 1:
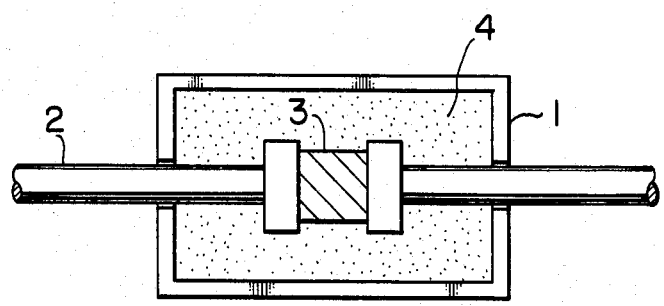
FIG. 1 is a schematic top plan view of a diode used in Examples and Comparative Examples mentioned below and FIG. 2 is a cross-sectional view of the diode of FIG. 1.

The epoxy resin composition used in the present invention is a one-pack type epoxy resin composition which has excellent storage stability at about room temperature, for example, stable over 4 months, and can be cured rapidly at 100 to 150° C. Since the epoxy resin composition is the one-pack type, it is not necessary to carry out troublesome procedures such as preliminary dispersion, weighing and mixing immediately before the use in the case of two- or multi-pack type epoxy resins.

As the epoxy resin having at least one epoxy group in its molecule, there can be used epichlorhydrin-bisphenol type epoxy resins and derivatives (e.g. halides) thereof obtained from bisphenol A or bisphenol F and epichlorhydrin; polyglycidyl ethers of polyhydric phenol type epoxy resins, e.g., novolac type epoxy resins and derivatives (e.g. halides) thereof obtained from phenol novolac resins or cresol novolac resins and epichlorhydrin; epoxy resins and derivatives thereof (e.g. halides) obtained from polyhydric alcohols and epichlorhydrin; diglycidyl esters and derivatives (e.g. halides) thereof obtained from polybasic acids and epichlorhydrin such as diglycidyl ester of phthalic acid, diglycidyl ester of hexahydrophthalic acid; epoxy resins having a hydantoin ring; methyl-substituted type epoxy resins obtained from dicyclopentadiene oxide, 3,4-epoxy-6-methylcyclohexylmethyl-3,4-epoxy-6-methyl-cyclohexane carboxylate, limonene dioxide, isobutylene, etc.

These epoxy resins can be used alone or as a mixture thereof. Among them, epoxy resins having two or more epoxy groups in their molecules are preferable. From the viewpoint of heat resistance, polyglycidyl ethers of polyhydric phenol type epoxy resins are more preferable.

As the organic dibasic acid dihydrazide, there can be used a reaction product of hydrazine and an organic dibasic acid. Examples of dibasic acids are oxalic acid, malonic acid, succinic acid, adipic acid, sebacic acid, dodecanoic acid, hexadecanoic acid, isophthalic acid, and the like. Examples of dibasic acid dihydrazide are succinic acid dihydrazide, malonic acid dihydrazide, adipic acid dihydrazide, isophthalic acid dihydrazide, etc. Among them, it is preferable to use adipic acid dihydrazide, isophthalic acid dihydrazide, or a mixture thereof.

The organic dibasic acid dihydrazide is used in an amount of 3 to 20 moles, preferably 3 to 15 moles, more preferably 6 to 12 moles, per 100 moles of the epoxy resin. When the amount of the organic dibasic acid dihydrazide is less than 3 moles, too much time is required for curing, and further the glass transition temperature of cured product becomes 120° C. or less, which results in making the heat resistance and thermal fatigue properties worse to lessen reliability. On the other hand, when the amount is more than 20 moles, a large heat is generated at the time of curing and shrinkage by reaction of epoxy resins becomes larger, which results in increasing stress to an element to easily cause breakage or cutting of bonding wires.

As the imidazole of the formula (I), there can be used 2-ethyl-4-methyl-5-hydroxymethylimidazole, 2-phenyl-4-methyl-5-hydroxymethylimidazole, 2-phenyl-4,5-dihydroxymethylimidazole, 2-ethyl-4,5-dihydroxymethylimidazole, etc.

The imidazole is used in an amount of 1 to 7 moles, preferably 1.5 to 5 moles, more preferably 1.5 to 3.5 moles, per 100 moles of the epoxy resin. When the amount is less than 1 mole, curing properties are lowered and heat resistance of cured product is lowered due to a decrease in glass transition temperature of cured product. On the other hand, when the amount is more than 7 moles, the storage stability of the epoxy resin composition becomes worse, the reaction shrinkage at the time of curing becomes large to give undesirable stress to the semiconductor element, and the amount of unreacted imidazole increases, which results in making the reverse direction leakage current in diodes, thyristors, etc., greater and lowering the avalanche breakdown voltage.

The epoxy resin composition may further contain one or more inorganic fillers such as silica powder, alumina, clay, talc, quartz glass powder, zirconium oxide, zirconium silicate, etc., coupling agents, colorants, flame retardants, and the like additives conventionally used.

As the semiconductor material, there can be used various kinds of diodes, thyristors, power transistors, metal-oxide semiconductor (MOS) transistors, and the like.

According to this invention, at least part of the surface of a body of semiconductor material or whole body of semiconductor material is covered by the seal coating obtained by curing the epoxy resin composition. The resulting epoxy resin sealed semiconductor elements are remarkably improved in moisture resistance, which results in making the semiconductor elements stable, lowered in failure rate and improved remarkably in reliability.

This invention is illustrated by way of the following Examples, in which all percents are by weight unless otherwise specified.

EXAMPLE 1

An epoxy resin composition was prepared by adding 60% of fused silica powder (Fuselex RD-8 manufactured by Tatsumori K.K.) to a composition comprising 100 moles of epichlorhydrin-bisphenol type epoxy resin having an epoxy equivalent weight of 190 (Epikote 828 manufactured by Yuka-Shell Epoxy K.K.), 10 moles of adipic acid dihydrazide and 2 moles of 2-phenyl-4,5-dihydroxymethylimidazole, followed by mixing in a vacuum mixing and grinding machine.

EXAMPLE 2

An epoxy resin composition was prepared by adding 60% of the same fused silica powder as used in Example 1 to a composition comprising 100 moles of epichlorhydrinbisphenol type epoxy resin having an epoxy equivalent weight of 190 (Epikote 828), 10 moles of adipic acid dihydrazide and 3 moles of 2-phenyl-4-methyl-5-hydroxymethylimidazole, followed by mixing in a vacuum mixing and grinding machine.

EXAMPLE 3

An epoxy resin composition was prepared by adding 0.5% of silane coupling agent ($\gamma$-glycidoxypropyltrimethoxysilane) and 50% of the same fused silica powder as used in Example 1 to a composition comprising 70 moles of epichlorhydrin-bisphenol type epoxy resin having an epoxy equivalent weight of 175 (Epikote 807 manufactured by Yuka-Shell Epoxy K.K.), 30 moles of phenol novolac type epoxy resin (DEN 431 manufactured by Dow Chemical Co.), 12 moles of sebacic acid dihydrazide and 2 moles of 2-phenyl-4-methyl5-hydroxymethylimidazole, followed by mixing in a vacuum mixing and grinding machine.

EXAMPLE 4

An epoxy resin composition was prepared by adding 60% of the same fused silica powder as used in Example 1 to a composition comprising 70 moles of epichlorhydrinbisphenol type epoxy resin having an epoxy equivalent weight of 190 (Epikote 828), 30 moles of epichlorhydrinbisphenol type epoxy resin having an epoxy equivalent weight of 175 (Epikote 807), 10 moles of adipic acid dihydrazide, and 4 moles of 2-phenyl-4,5-dihydroxymethylimidazole, followed by mixing in a vacuum mixing and grinding machine.

COMPARITIVE EXAMPLE 1

An epoxy resin composition was prepared by adding 60% of the same fused silica powder as used in Example 1 to a composition comprising 100 moles of epichlorhydrinbisphenol type epoxy resin having an epoxy equivalent weight of 190 (Epikote 828), 7 moles of dicyandiamide and 3 moles of 2-phenyl-4-methyl-5-hydroxymethylimidazole, followed by mixing in a vacuum mixing and grinding machine.

COMPARITIVE EXAMPLE 2

An epoxy resin composition was prepared by adding 60% of the same fused silica powder as used in Example 1 to a composition comprising 100 moles of epichlorhydrinbisphenol type epoxy resin having an epoxy equivalent weight of 190 (Epikote 828), 2 moles of adipic acid dihydrazide and 0.5 mole of 2-phenyl-4,5-dihydroxymethylimidazole, followed by mixing in a vacuum mixing and grinding machine.

COMPARITIVE EXAMPLE 3

An epoxy resin composition was prepared by adding 60% of the same fused silica powder as used in Example 1 to a composition comprising 100 moles of epichlorhydrinbisphenol type epoxy resin having an epoxy equivalent weight of 190 (Epikote 828), 30 moles of adipic acid dihydrazide and 8 moles of 2-phenyl-4,5-dihydroxymethylimidazole, followed by mixing in a vacuum mixing and grinding machine.

Figure 2:
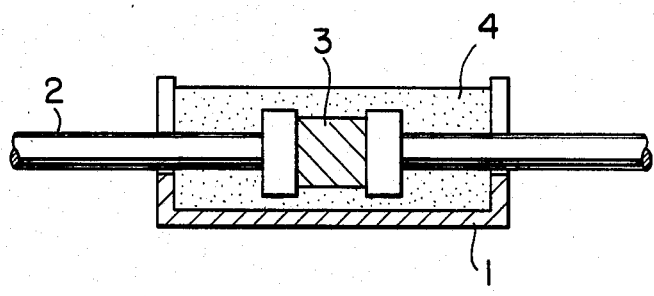

The epoxy resin compositions obtained in Examples 1 to 4 and Comparative Examples 1 to 3 were coated on diodes as shown in FIGS. 1 and 2 of rated voltage of 600 Vp and cured for sealing at 120° C. for 3 hours followed by heating at 160° C. for 5 hours.

In FIGS. 1 and 2, numeral 1 denotes a case, 2 a lead electrode, 3 a silicon pellet, and 4 an epoxy resin composition. The case has a size of 6.0 mm wide, 8.0 mm long and 5.0 mm high and the lead electrode has a diameter of 1.0 mm. The resulting epoxy resin coated diodes were tested in the following properties:

(1) Reverse Current Evaluation

After curing and sealing the epoxy resin compositions, the reverse current (Ir) was measured. The voltage applied ($V_R$) was 700 Vp. When the Ir was more than 3 times the Ir before molding, the evaluation was NG, while when the Ir was 3 times or less, the evaluation was OK. The number of samples was 20 for each compsition.

(2) Pressure Cooker Test Evaluation

Each sample obtained by curing and sealing each diode with each epoxy resin composition was allowed to stand in a pressured moisture resistance test apparatus at a temperature of 121° C. and a humidity of 100% for 200 hours. Then, the Ir was measured in the same manner as described in above item (1). When the Ir was more than 5 times the Ir before molding, the evaluation was NG, while when the Ir was 5 times or less the Ir before molding, the evaluation was OK. The number of samples was 30 for each resin composition.

The test results are shown in Table 1.

TABLE 1

| Example No. | Reverse current evaluation | Pressure Cooker test evaluation |
| --- | --- | --- |
| Example 1 | 0/20 | 0/30 |
| Example 2 | 0/20 | 1/30 |
| Example 3 | 0/20 | 0/30 |
| Example 4 | 1/20 | 0/30 |
| Comparative Example 1 | 2/20 | 8/30 |
| Comparative Example 2 | 0/20 | 12/30 |
| Comparative Example 3 | 5/20 | 3/30 |

Note: (NG number/Sample number)

EXAMPLE 5

An epoxy resin composition was prepared by mixing 1 mole of epichlorhydrin-bisphenol type epoxy resin having an epoxy equivalent weight of 190 (Epikote 828), 0.05 mole of adipic acid dihydrazide and 0.04 mole of 2-phenyl-4-methyl-5-hydroxymethylimidazole.

EXAMPLE 6

An epoxy resin composition was prepared by mixing 1 mole of epichlorhydrin-bisphenol type epoxy resin having an epoxy equivalent weight of 190 (Epikote 828), 0.07 mole of dodecan dicarboxylic acid dihydrazide, and 0.03 mole of 2-phenyl-4-methyl-5-hydroxymethylimidazole.

EXAMPLE 7

An epoxy resin composition was prepared by mixing 0.5 mole of epichlorhydrin-bisphenol type epoxy resin having an epoxy equivalent weight of 190 (Epikote 828), 0.5 mole of phenol novolac type epoxy resin having an epoxy equivalent weight of 175 (DEN 431), 0.1 mole of succinic acid dihydrazide, and 0.03 mole of 2-phenyl-4-methyl-5-hydroxymethylimidazole.

EXAMPLE 8

An epoxy resin composition was prepared by mixing 1 mole of epichlorhydrin-bisphenol type epoxy resin having an epoxy equivalent weight of 190 (Epikote 828), 0.1 mole of isophthalic acid dihydrazide, and 0.04 mole of 2-phenyl-4,5-dihydroxymethylimidazole.

COMPARATIVE EXAMPLE 4

An epoxy resin composition was prepared by mixing 1 mole of epichlorhydrin-bisphenol type epoxy resin having an epoxy equivalent weight of 190 (Epikote 828), 0.1 mole of adipic acid dihydrazide, and 0.1 mole of 2-phenyl-4-methyl-5-hydroxymethylimidazole.

COMPARITIVE EXAMPLE 5

An epoxy resin composition was prepared by mixing 1 mole of phenol novolac type epoxy resin having an epoxy equivalent weight of 175 (DEN 431), 0.1 mole of dicyandiamide, and 0.04 mole of 2-phenyl-4-methyl-5-hydroxymethylimidazole.

The epoxy resin compositions of Examples 5 to 8 and Comparative Examples 4 and 5 were subjected to the following treatments and tests.

(1) Preparation of Samples:

Each composition was subjected to stirring with a laboratory stirrer, followed by sufficient kneading by a small three-roll mill. Subsequently, the mixture was subjected to deaeration under vacuum of 5 Torr in a vacuum mixing and grinding machine. Then, the resulting mixture was coated on a metal laboratory dish with a film thickness of 0.3 to 0.7 mm and cured at 120° C. for 2 hours and at 150° C. for 4 hours to give a sample.

(2) Measurement of Gel Time:

On a hot plate maintained at a predetermined temperature, 1 g of a sample taken out of the above-mentioned kneaded mixture was placed and stirred with a microspatula and a time required for losing flowability of the resin was defined as a gel time.

(3) Measurement of Glass Transition Temperature:

A sample with 0.3 to 0.7 mm thick cured at 120° C. for 2 hours and 150° C. for 4 hours was subjected to measurement of linear expansion coefficient by using a thermophysical tester TMS-1 manufactured by Perkin Elmer Co., Ltd. and an inflection point of a curve obtained was defined as glass transition temperature.

(4) Measurement of Usable Time:

A sample obtained from the kneaded mixture mentioned in above (1) in an amount of 200 g was allowed to stand in a closed vessel maintained at a prescribed temperature and the viscosity at 25° C. was measured every day. A time sequired for reaching 1.5 times as large as the initial viscosity was defined as usable time.

The results are shown in Table 2.

TABLE 2

| Item | Example 5 | Example 6 | Example 7 | Example 8 | Comparative Example 4 | Comparative Example 5 |
|---|---|---|---|---|---|---|
| Gel time (min.) | | | | | | |
| 100° C. | 40.5 | 35.5 | 41.0 | 35.0 | 36.0 | 95.5 |
| 120° C. | 12.0 | 13.0 | 10.5 | 10.0 | 8.0 | 60.0 |
| 140° C. | 4.5 | 5.0 | 4.0 | 4.0 | 3.0 | 25.5 |
| Glass transition temperature (°C.) | 166 | 158 | 167 | 172 | 148 | 69 |
| Usable time (days) | | | | | | |
| 25° C. | 100 | 100 | 100 | 90 | 23 | 100 |
| 40° C. | 23 | 25 | 30 | 21 | 7 | 30 |
| 60° C. | 6 | 6 | 6 | 4 | 0.5 | 7 |

What is claimed is:

1. A process for producing a semiconductor element which comprises forming a seal coating on at least part of the surface of a body of semiconductor material, said seal coating being a cured resin obtained from an epoxy resin composition comprising
    (i) an epoxy resin having at least one epoxy group in its molecule,
    (ii) an organic dibasic acid dihydrazide in an amount of 3 to 20 moles per 100 moles of the epoxy compound, and
    (iii) an imidazole of the formula:

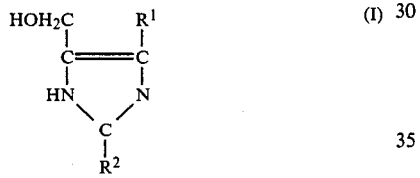

(I)

wherein $R^1$ is hydrogen, a methyl, ethyl or a hydroxymethyl group; and $R^2$ is a methyl, ethyl or a phenyl group, in an amount of 1 to 7 moles per 100 moles of the epoxy resin.

2. A process according to claim 1, wherein the epoxy resin is an epichlorhydrin-bisphenol type epoxy resin.

3. A process according to claim 1, wherein the epoxy resin is a novolac type epoxy resin.

4. A process according to claim 1, wherein the organic dibasic adid dihydrazide is obtained from a dibasic acid selected from the group consisting of succinic acid, malonic acid, adipic acid and isophthalic acid.

5. A process according to claim 1, wherein the imidazole is 2-ethyl-4-methyl-5-hydroxymethylimidazole, 2-phenyl-4-methyl-5-hydroxymethylimidazole, 2-phenyl-4,5-dihydroxymethylimidazole or 2-ethyl-4,5-dihydroxymethylimidazole.

6. A process according to claim 1, wherein the semiconductor material is a diode, a thyristor, a power transistor or a metal-oxide semiconductor transistor.

7. A semiconductor element comprising a body of semiconductor material provided with a layer of cured resin over at least part of the surface thereof, said cured resin having been obtained from an epoxy resin composition comprising
    (i) an epoxy resin having at least one epoxy group in its molecule,
    (ii) an organic dibasic acid dihydrazide in an amount of 3 to 20 moles per 100 moles of the epoxy resin, and
    (iii) an imidazole of the formula:

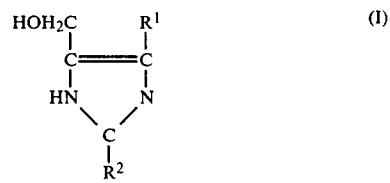

(I)

wherein $R^1$ is hydrogen, a methyl, ethyl or a hydroxymethyl group; and $R^2$ is a lower methyl, ethyl or a phenyl group, in an amount of 1 to 7 moles per 100 moles of the epoxy resin.

8. An epoxy resin composition comprising
    (i) an epoxy resin having at least one epoxy group in its molecule,
    (ii) an organic dibasic acid dihydrazide in an amount of 3 to 20 moles per 100 moles of the epoxy resin, and
    (iii) an imidazole of the formula:

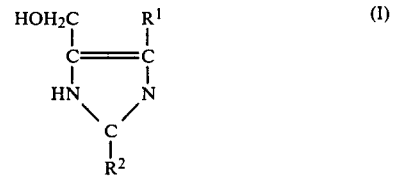

(I)

wherein $R^1$ is a hydrogen, a methyl, ethyl or a hydroxymethyl group; and $R^2$ is methyl, ethyl or a phenyl group, in an amount of 1 to 7 moles per 100 moles of the epoxy resin.

9. A composition according to claim 8, wherein the epoxy resin is an epichlorhydrin-bisphenol epoxy resin.

10. A composition according to claim 8, wherein the epoxy resin is a novolac type epoxy resin.

11. A composition according to claim 8, wherein the organic dibasic acid dihydrazide is obtained from a dibasic acid selected from the group consisting of succinic acid, malonic acid, adipic acid and isophthalic acid.

12. A composition according to claim 8, wherein the imidazole is 2-ethyl-4-methyl-5-hydroxymethylimidazole, 2-phenyl-4-methyl-5-hydroxymethylimidazole, 2-phenyl-4,5-dihydroxymethylimidazole or 2-ethyl-4,5-dihydroxymethylimidazole.

13. A semiconductor element according to claim 7, wherein the semiconductor material is a diode, a thyristor, a power transistor or a metal-oxide semiconductor transistor.

14. A process according to claim 1, wherein $R^1$ is a methyl group and $R^2$ is phenyl group.

15. A process according to claim 2, wherein the epichlorohydrin-bisphenol epoxy resin is obtained from bisphenol A or bisphenol F and epichlorohydrin.

16. A process according to claim 3, wherein the novolac epoxy resin is obtained from a phenol novolac resin or a cresol novolac resin and epichlorohydrin.

17. A semiconductor element according to claim 7, wherein $R^1$ is a methyl group and $R^2$ is a phenyl group.

18. A composition according to claim 8, wherein $R^1$ is a methyl group and $R^2$ is a phenyl group.

19. A composition according to claim 9, wherein the epichlorohydrin-bisphenol epoxy resin is obtained from bisphenol A or bisphenol F and epichlorohydrin.

20. A composition according to claim 10, wherein the novolac epoxy resin is obtained from a phenol novolac resin or a cresol novolac resin and epichlorohydrin.

* * * * *